(12) United States Patent
Sone

(10) Patent No.: US 8,747,990 B2
(45) Date of Patent: Jun. 10, 2014

(54) COATED TOOL

(75) Inventor: Yohei Sone, Iwaki (JP)

(73) Assignee: Tungaloy Corporation, Fukushima (JP)

( * ) Notice: Subject to any disclaimer, the term of this patent is extended or adjusted under 35 U.S.C. 154(b) by 0 days.

(21) Appl. No.: 13/508,010

(22) PCT Filed: Nov. 8, 2010

(86) PCT No.: PCT/JP2010/069791
§ 371 (c)(1),
(2), (4) Date: May 3, 2012

(87) PCT Pub. No.: WO2011/055813
PCT Pub. Date: May 12, 2011

(65) Prior Publication Data
US 2012/0225247 A1  Sep. 6, 2012

(30) Foreign Application Priority Data

Nov. 6, 2009  (JP) .................................. 2009-254703

(51) Int. Cl.
*B32B 7/02* (2006.01)
*B32B 3/00* (2006.01)
*B32B 5/00* (2006.01)

(52) U.S. Cl.
USPC ........... 428/141; 407/119; 428/216; 428/212; 428/698; 428/701

(58) Field of Classification Search
None
See application file for complete search history.

(56) References Cited

U.S. PATENT DOCUMENTS

| | | | |
|---|---|---|---|
| 5,654,035 A | | 8/1997 | Ljungberg et al. |
| 5,766,782 A | * | 6/1998 | Ljungberg ............... 428/698 |
| 6,071,601 A | * | 6/2000 | Oshika et al. ............ 428/216 |
| 6,284,356 B1 | | 9/2001 | Kiriyama |
| 6,333,103 B1 | * | 12/2001 | Ishii et al. ............... 428/325 |
| 6,756,111 B1 | * | 6/2004 | Okada et al. ............. 428/216 |
| 7,476,064 B2 | * | 1/2009 | Ishii ........................ 407/119 |
| 2001/0006724 A1 | * | 7/2001 | Holzschuh ............... 428/336 |

(Continued)

FOREIGN PATENT DOCUMENTS

| | | |
|---|---|---|
| JP | 7-290302 | 11/1995 |
| JP | 7-299608 | 11/1995 |

(Continued)

OTHER PUBLICATIONS

S. Ruppi, "Deposition, microstructure and properties of texture-controlled CVD (alpha)-Al2O3 coatings". International Journal of Refractory Metals & Hard Materials 23 (2005) 306-316.*

(Continued)

*Primary Examiner* — Aaron Austin
*Assistant Examiner* — Donald M Flores, Jr.
(74) *Attorney, Agent, or Firm* — Womble Carlyle

(57) ABSTRACT

A coated tool is excellent in adhesiveness of film, wear resistance, crater resistance and chipping resistance. The coated tool has a substrate and a coating coated on the surface thereof, at least one layer of the coating being an α-type aluminum oxide film, an average film thickness of the α-type aluminum oxide film being about 0.5 to about 10 μm, an average grain size of the α-type aluminum oxide film being about 0.5 to about 1.5 μm, and a texture coefficient $TC_A(012)$ of (012) plane of the α-type aluminum oxide film and a texture coefficient $TC_A(104)$ of (104) plane of the α-type aluminum oxide film satisfying $TC_A(104)/TC_A(012) \geq 2.0$.

18 Claims, 2 Drawing Sheets

(56) References Cited

U.S. PATENT DOCUMENTS

| | | |
|---|---|---|
| 2001/0036388 A1 | 11/2001 | Kodama et al. |
| 2003/0022029 A1 | 1/2003 | Kidama et al. |
| 2006/0141271 A1 | 6/2006 | Ruppi |
| 2008/0057280 A1 | 3/2008 | Watanabe et al. |
| 2008/0187775 A1 | 8/2008 | Ruppi et al. |
| 2008/0292905 A1* | 11/2008 | Okada et al. .................. 428/702 |
| 2008/0311290 A1 | 12/2008 | Ruppi |
| 2010/0232893 A1 | 9/2010 | Imamura et al. |
| 2010/0330360 A1 | 12/2010 | Tanibuchi et al. |

FOREIGN PATENT DOCUMENTS

| | | |
|---|---|---|
| JP | 8-003750 | 1/1996 |
| JP | 8-020871 | 1/1996 |
| JP | 8-027562 | 1/1996 |
| JP | 8-302472 | 11/1996 |
| JP | 11-256336 | 9/1999 |
| JP | 2002370105 | 12/2002 |
| JP | 2003025114 | 1/2003 |
| JP | 2005271123 | 10/2005 |
| JP | 2009-202264 | 9/2009 |

OTHER PUBLICATIONS

International Preliminary Report on Patentability (IPRP) dated May 8, 2012 issued in PCT counterpart application (PCT/JP2010/069791).

International Search Report in PCT/JP2010/069791, dated Dec. 21, 2010.

Philips Centre Manuf. Technol, Eindoven, Netherlands, 1983, p. 410-420.

Extended European search report dated Nov. 13, 2013 issued in European counterpart application (No. 10828371.4).

* cited by examiner

COATED TOOL

RELATED APPLICATIONS

This is a 371 US National Phase of International Patent Application No. PCT/JP2010/069791, filed Nov. 8, 2010, and published as WO 2011/055813A1 on May 12, 2011, which claims priority to JP 2009-254703, filed Nov. 6, 2009. The contents of the aforementioned applications are incorporated by reference in their entirety.

TECHNICAL FIELD

The present invention relates to a coated tool in which a coating film is coated on the surface of a substrate, and to a coated tool wherein at least one layer of the coating film is an α-type aluminum oxide film.

BACKGROUND ART

In cutting, a coated tool in which a TiCN film or an aluminum oxide film is coated on the surface of a cemented carbide substrate has frequently been used. As the prior art of the coated tool, there is a coated material at least partially coated with one or more refractory layers of which at least one layer is a layer of alumina, said alumina layer has a thickness of d=0.5-25 μm, and consisting of a single phase α-structure having a grain size (S), said grain size (S) being 0.5 μm<S<1 μm for 0.5 μm<d<2.5 μm, and said grain size (S) being 0.5 μm<S<3 μm for 2.5 μm<d<25 μm, said alumina layer exhibits a texture coefficient (TC) greater than 1.3 for the (012) growth direction of the equivalent crystallographic planes defined by the following formula, $$TC(012) = \frac{I(012)}{I_o(012)} \left\{ \frac{1}{n} \sum \frac{I(hkl)}{I_o(hkl)} \right\}^{-1}, \quad \text{Formula}$$

wherein I(hkl)=measured intensity of the (hkl) reflection, $I_o$(hkl)=standard intensity of the ASTM standard power pattern diffraction data, n=number of reflections, and (hkl) reflection are (012), (104), (110), (113), (024), (116) (for example, see Patent Literature 1.). However, the coated material involves the problem that it cannot show sufficient performances in a processing requiring chipping resistance, in particular, in cutting of a steel.

Also, there is a coated cemented carbide in which an α-type aluminum oxide film showing TC(1,0,−1,4)=3.39, TC(1,0,−1,2)=0.27 and TC(1,0,−1,4)/TC(1,0,−1,2)=12.6 is coated on the surface of a cemented carbide to which a TiN film has been coated (for example, see Non-Patent Literature 1, p. 417, Table 2.). However, this coated cemented carbide has extremely coarse α-type aluminum oxide grains in the α-type aluminum oxide film, so that there is a problem that it is inferior in wear resistance at high temperature.

[Patent Literature 1] JP H06-316758A

[Non-Patent Literature 1] written by Chul-Soon Park, et al., "The effect of reaction condition on the crystallographic orientation and surface morphology of chemical vapor deposited Al$_2$O$_3$", Proceedings of the 4th European Conference on Chemical Vapour Deposition, published by Philips Centre Manuf. Technol, Eindoven, Netherlands, 1983, P. 410-420

DISCLOSURE OF THE INVENTION

Problems to be Solved by the Invention

At the production site, there is a requirement that a cutting time is shortened to improve productivity. Therefore, cutting has been carried out under severe cutting conditions such as high speed, high feeding, and heavy interrupted cutting. Under such severe cutting conditions, too life of the conventional coated tool becomes short, so that a coated tool having longer tool life than before has been demanded. Also, in a wear resistant tool represented by a die, increase in tool life has been demanded for the purpose of improving productivity. The present invention has been done in view of such a circumstance, and an object thereof is to provide a coated tool excellent in adhesiveness of the film, wear resistance, crater resistance and chipping resistance.

Means to Solve the Problems

The present inventor have researched on a coated tool in which an α-type aluminum oxide film is coated, he has found that when an average film thickness of the α-type aluminum oxide film is controlled to about 0.5 to about 10 μm, an average grain size of the aluminum oxide grains in the α-type aluminum oxide film to about 0.5 to about 1.5 μm, and an orientation of the α-type aluminum oxide film is controlled so that $TC_A(104)/TC_A(012)$ which is a ratio of a texture coefficient $TC_A(104)$ of a (104) plane to a texture coefficient $TC_A(012)$ of a (012) plane of the α-type aluminum oxide film to 2.0 or more, then, adhesiveness of the film, wear resistance, crater resistance and chipping resistance are improved. Moreover, when a B1-type metal compound film is formed between the substrate and the α-type aluminum oxide film, he obtained the knowledge that when an average grain size of the B1-type metal compound grains in the B1-type metal compound film is controlled to about 0.15 to about 0.3 μm, a maximum grain size of the B1-type metal compound grains in the B1-type metal compound film is controlled to about 1.0 μm or less, and $TC_B(422)/TC_B(311)$ which is a ratio of a texture coefficient $TC_B(422)$ of a (422) plane of the B1-type metal compound film to a texture coefficient $TC_B(311)$ of a (311) plane of the B1-type metal compound film is controlled to 1.5 or higher, then, adhesiveness of the film, wear resistance, crater resistance and chipping resistance are further improved.

Effects of the Invention

The coated tool of the present invention is excellent in adhesiveness of the film, wear resistance, crater resistance and chipping resistance. When the coated tool of the present invention is used as a cutting tool or a wear resistant tool, tool life thereof is increased.

EMBODIMENTS TO CARRY OUT THE INVENTION

Figure 1:
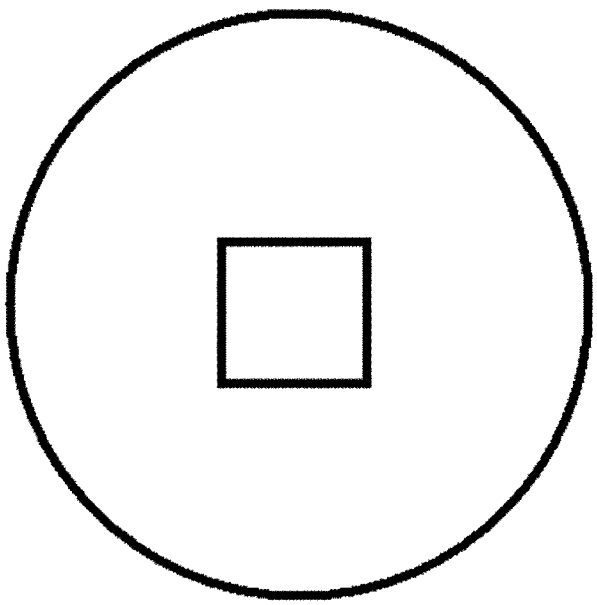
FIG. 1 This is a drawing showing a cross-section shape of a work piece material.
Figure 1A:
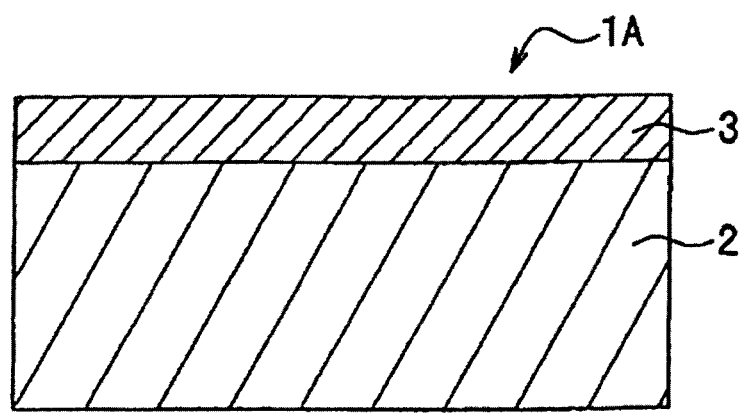
FIG. 1A This is a drawing showing a side view of a cutting tool having a coating.

FIG. 1A shows a cutting tool 1A in accordance with the present invention having a substrate 2 with a coating 3 on top of the substrate 2. The substrate of the present invention is not particularly limited, and a material having both of hardness and toughness is preferred, which may be mentioned, for example, ceramics, alloy steel, cemented carbide, cermet, etc. Among these, a cemented carbide or cermet is preferred. The cemented carbide or cermet is an alloy comprising a hard phase which comprises a carbide, nitride, carbonitride, oxide, carboxide, nitroxide, carbonitroxide and/or boride of Ti, Zr, Hf, V, Nb, Ta, Cr, Mo, W, Al and/or Si and mutual solid solutions thereof, a binder phase mainly comprising Co, Ni and/or Fe, and inevitable impurities. Among these, a cemented carbide mainly comprising WC is further preferred since it is excellent in toughness. To further have toughness to the cemented carbide used as the substrate, it is preferred to provide a β-free layer comprising WC and a binder phase in which a cubic crystal phase (β phase) such as (W,Ti)C and (W,Ti,Ta)C is disappeared at the neighbor of the surface of the cemented carbide substrate with a thickness of about 5 to about 40 μm from the surface of the alloy to the depth direction.

It is preferred to apply to the surface of the substrate machining represented by wet grinding, dry grinding and blasting, or chemical processing represented by electrolytic polishing to have preciseness of the tool shape to the substrate of the present invention.

The coating of the present invention comprises the α type aluminum oxide film of the present invention, or, comprises one or more metal compound films comprising a carbide, nitride, oxide, carbonitride, carboxide, nitroxide, carbonitroxide or boride of Ti, Zr, Hf, V, Nb, Ta, Cr, Mo, W, Al or Si and a mutual solid solutions thereof and the α type aluminum oxide film of the present invention. On the surface of the substrate of the present invention, the α type aluminum oxide film of the present invention may be directly coated, but to improve wear resistance and chipping resistance, a metal compound film is coated on the surface of the substrate, and the α type aluminum oxide film may be further coated on the surface of the metal compound film. When the metal compound film is coated on the substrates such as a cemented carbide, cermet, etc., a component(s) of the substrate such as W, C, Co, Mo, Cr, V, etc., may sometimes be migrated from the substrate to the metal compound film, but, even in this case, the essential effects of the α type aluminum oxide film of the present invention are not changed. Incidentally, it is preferred to coat a metal compound film on the surface of the α type aluminum oxide film according to the present invention to distinguish the corner used for cutting by the difference at the coated in difference such as a color, etc. The method for coating the coating of the present invention to the substrate, there may be mentioned a physical vapor deposition method or a chemical vapor deposition method, etc.

The α type aluminum oxide film of the present invention has an average film thickness of about 0.5 to about 10 μm, an average grain size of about 0.5 to about 1.5 μm, and a texture coefficient $TC_A(012)$ of a (012) plane of the α type aluminum oxide film shown by the following Numerical formula 1, and a texture coefficient $TC_A(104)$ of a (104) plane of the α type aluminum oxide film shown by the following Numerical formula 2 satisfy $TC_A(104)/TC_A(012) \geq 2.0$.

[Numerical formula 1]
$$TC_A(012) = \frac{\left(\frac{I_A(012)}{I_{A0}(012)}\right)}{\frac{1}{8}\left[\frac{I_A(012)}{I_{A0}(012)} + \frac{I_A(104)}{I_{A0}(104)} + \frac{I_A(110)}{I_{A0}(110)} + \frac{I_A(113)}{I_{A0}(113)} + \frac{I_A(024)}{I_{A0}(024)} + \frac{I_A(116)}{I_{A0}(116)} + \frac{I_A(124)}{I_{A0}(124)} + \frac{I_A(030)}{I_{A0}(030)}\right]}$$

$I_A$(hkl): X-ray diffraction intensity measured at the (hkl) plane of the α type aluminum oxide film $I_{A0}$(hkl): Standard X-ray diffraction intensity of the (hkl) plane of the α type aluminum oxide according to the JCPDS card No. 10-173

(hkl) are eight planes of (012), (104), (110), (113), (024), (116), (124) and (030)

[Numerical formula 2]
$$TC_A(104) = \frac{\left(\frac{I_A(104)}{I_{A0}(104)}\right)}{\frac{1}{8}\left[\frac{I_A(012)}{I_{A0}(012)} + \frac{I_A(104)}{I_{A0}(104)} + \frac{I_A(110)}{I_{A0}(110)} + \frac{I_A(113)}{I_{A0}(113)} + \frac{I_A(024)}{I_{A0}(024)} + \frac{I_A(116)}{I_{A0}(116)} + \frac{I_A(124)}{I_{A0}(124)} + \frac{I_A(030)}{I_{A0}(030)}\right]}$$

$I_A$(hkl): X-ray diffraction intensity measured at the (hkl) plane of the α type aluminum oxide film $I_{A0}$(hkl): Standard X-ray diffraction intensity of the (hkl) plane of the α type aluminum oxide according to the JCPDS card No. 10-173

(hkl) is eight planes of (012), (104), (110), (113), (024), (116), (124) and (030)

The α type aluminum oxide film of the present invention has high strength of a grain boundary so that crack is difficultly caused and adhesiveness to the ground is excellent. Among these, $TC_A(104)/TC_A(012)$ is more preferably 4.0 or more, and $TC_A(104)/TC_A(012)$ is further preferably 6.0 or more. The α type aluminum oxide film of the present invention has high strength of a grain boundary so that crack is difficultly caused and adhesiveness to the ground, whereby dropping and breakage of the crystal grains of the coating are reduced at the time of cutting. Therefore, the coated tool in which the α type aluminum oxide film of the present invention is coated thereon is excellent in adhesiveness of the film, wear resistance, crater resistance and chipping resistance.

The X-ray diffraction intensity of the α type aluminum oxide film according to the present invention can be measured by using the usual X-ray diffraction device equipped with a Cu bulb according to the 2θ/θ method. The X-ray diffraction intensity in the present invention is made a peak height of the X-ray diffraction chart obtained by the X-ray diffraction measurement. In Table 1, a plane distance d (Å) and a standard X-ray diffraction intensity $I_{A0}$ corresponding to the respective crystal planes of the α type aluminum oxide mentioned at No. 10-173 of the JCPDS card are shown. In addition, 2θ(°) of the respective crystal planes which can be calculated from the wavelength 1.54056 Å of the Kα1 line of Cu and the plane distance d (Å) of the respective crystal planes is shown in Table 1.

TABLE 1

| | | (hkl) | | | | | | | |
|---|---|---|---|---|---|---|---|---|---|
| | | (012) | (104) | (110) | (113) | (024) | (116) | (124) | (030) |
| α-Al$_2$O$_3$ | d (Å) | 3.479 | 2.552 | 2.379 | 2.085 | 1.740 | 1.601 | 1.546 | 1.374 |
| | 2θ (°) | 25.58 | 35.14 | 37.78 | 43.36 | 52.55 | 57.52 | 66.55 | 68.20 |
| | I$_{40}$ | 75 | 90 | 40 | 100 | 45 | 80 | 30 | 50 |

When the measured range of 2θ is defined to be 20° to 75°, an X-ray diffraction intensity I$_A$ (hkl) from a (012) plane to a (030) plane of the α type aluminum oxide film can be measured.

From the obtained X-ray diffraction intensity I$_A$ (hkl) from the (012) plane to the (030) plane of the α type aluminum oxide, a texture coefficient TC$_A$(012) defined by the Numerical formula 1, and the TC$_A$(104) defined by the Numerical formula 2 can be obtained.

The α type aluminum oxide film of the present invention shows columnar crystal. The columnar crystal referred to in the present invention means a crystal in which a grain diameter measured at the direction perpendicular to the surface of the substrate is longer than that measured at the direction parallel to the surface of the substrate.

An average grain size of the α type aluminum oxide grains in the α type aluminum oxide film of the present invention can be obtained by taking a SEM photograph of the surface structure of the α type aluminum oxide film to the direction parallel to the substrate surface magnified to 10,000-fold by SEM (scanning type electron microscope), drawing three or more lines on the SEM photograph to the random directions, measuring distances between crystal grain boundaries of the α type aluminum oxide film crossed the lines, and making the average value an average grain size of the α type aluminum oxide grains. When a metal compound film is coated on the surface of the α type aluminum oxide film of the present invention, the surface of the α type aluminum oxide film can be preferably observed after removing the same with fluoronitric acid, etc. If the average grain size of the α type aluminum oxide grains in the a type aluminum oxide film of the present invention is less than about 0.5 μm, fracture resistance is lowered, while if the average grain size of the α type aluminum oxide grains in the α type aluminum oxide film becomes large exceeding about 1.5 μm, wear resistance is lowered, so that the average grain size of the α-type aluminum oxide grains in the α type aluminum oxide film is set to about 0.5 to about 1.5 μm. Also, if the average film thickness of the α type aluminum oxide film according to the present invention is less than about 0.5 μm, wear resistance is lowered, while if the average film thickness of the α type aluminum oxide film becomes thick exceeding about 10 μm, fracture resistance is lowered, so that the average film thickness of the α type aluminum oxide film is set to about 0.5 to about 10 μm.

The α-type aluminum oxide film of the present invention may contain, as inevitable impurities, sulfur, a sulfide, selenium and/or tellurium in an amount of 1 atomic % or less in total based on the whole α-type aluminum oxide film of the present invention.

When the B1-type metal compound film of the present invention is coated between the substrate and the α-type aluminum oxide film, adhesiveness between the α-type aluminum oxide film and the substrate is markedly improved, and wear resistance, crater resistance and chipping resistance are further improved. When the B1-type metal compound film of the present invention is at least one of a carbide, nitride and carbonitride of an element of Groups 4 (Ti, Zr, Hf, etc.), 5 (V, Nb, Ta, etc.) and 6 (Cr, Mo, W, etc.) of the Periodic Table, and mutual solid solutions thereof, it is excellent in wear resistance so that it is more preferred. Among these, when it comprises a carbonitride of Ti, it is further preferred.

An average grain size of the B1-type metal compound grains in the B1-type metal compound film of the present invention is about 0.15 to about 0.3 μm, a maximum grain size of the B1-type metal compound grains in the B1-type metal compound film is about 1.0 μm or less, and a texture coefficient TC$_B$(422) of a (422) plane of the B1-type metal compound film shown by the following Numerical formula 3, and a texture coefficient TC$_B$(311) of a (311) plane of the B1-type metal compound film shown by the following Numerical formula 4 satisfy TC$_B$(422)/TC$_B$(311)≥1.5.

$$TC_B(422) = \frac{\frac{I_B(422)}{I_{B0}(422)}}{\frac{1}{8}\left[\frac{I_B(111)}{I_{B0}(111)} + \frac{I_B(220)}{I_{B0}(220)} + \frac{I_B(200)}{I_{B0}(200)} + \frac{I_B(311)}{I_{B0}(311)} + \frac{I_B(331)}{I_{B0}(331)} + \frac{I_B(420)}{I_{B0}(420)} + \frac{I_B(422)}{I_{B0}(422)} + \frac{I_B(511)}{I_{B0}(511)}\right]}$$ [Numerical formula 3]

I$_B$(hkl): X-ray diffraction intensity measured at the (hkl) plane of the B1-type metal compound film
I$_{B0}$(hkl): Average value of standard X-ray diffraction intensity of the (hkl) plane of TiC according to the JCPDS card No. 32-1383 and standard X-ray diffraction intensity of the (hkl) plane of TiN according to the JCPDS card No. 38-1420
(hkl) is eight planes of (111), (220), (200), (311), (331), (420), (422) and (511)

$$TC_B(311) = \frac{\frac{I_B(311)}{I_{B0}(311)}}{\frac{1}{8}\left[\frac{I_B(111)}{I_{B0}(111)} + \frac{I_B(220)}{I_{B0}(220)} + \frac{I_B(200)}{I_{B0}(200)} + \frac{I_B(311)}{I_{B0}(311)} + \frac{I_B(331)}{I_{B0}(331)} + \frac{I_B(420)}{I_{B0}(420)} + \frac{I_B(422)}{I_{B0}(422)} + \frac{I_B(511)}{I_{B0}(511)}\right]}$$ [Numerical formula 4]

I$_B$(hkl): X-ray diffraction intensity measured at the (hkl) plane of the B1-type metal compound film
I$_{B0}$(hkl): Average value of standard X-ray diffraction intensity of the (hkl) plane of TiC according to the JCPDS card No. 32-1383 and standard X-ray diffraction intensity of the (hkl) plane of TiN according to the JCPDS card No. 38-1420
(hkl) is eight planes of (111), (220), (200), (311), (331), (420), (422) and (511)

X-ray diffraction intensity of the B1-type metal compound film of the present invention can be measured by using an X-ray diffraction device equipped with a Cu bulb according to the 2θ/θ method. In Table 2, a plane distance d (Å) and standard X-ray diffraction intensity $I_0$ corresponding to the respective crystal planes of TiC shown in the JCPDS card No. 32-1383, a plane distance d (Å) and standard X-ray diffraction intensity $I_0$ corresponding to the respective crystal planes of TiN shown in the JCPDS card No. 38-1420, and an average value $I_{B0}$ of the standard X-ray diffraction intensity $I_o$ of TiC and the standard X-ray diffraction intensity $I_o$ of TiN are shown. Also, 2θ (°) of the respective crystal planes which can be obtained from a wavelength of 1.54056 Å of Cu Kα 1 line and a plane distance d (Å) of the respective crystal planes are shown in Table 2.

TABLE 2

|  |  | (hkl) | | | | | | |
|---|---|---|---|---|---|---|---|---|
|  |  | (111) | (200) | (220) | (311) | (420) | (422) | (511) |
| TiC | d (Å) | 2.4990 | 2.1637 | 1.5302 | 1.3047 | 0.9677 | 0.8834 | 0.8327 |
|  | 2θ (°) | 35.906 | 41.710 | 60.448 | 72.369 | 105.497 | 121.372 | 135.348 |
|  | $I_0$ | 80.0 | 100.0 | 60.0 | 30.0 | 25.0 | 25.0 | 16.0 |
| TiN | d (Å) | 2.4492 | 2.1207 | 1.4997 | 1.2789 | 0.9485 | 0.8658 | 0.8164 |
|  | 2θ (°) | 36.662 | 42.596 | 61.812 | 74.068 | 108.607 | 125.672 | 141.312 |
|  | $I_0$ | 72.0 | 100.0 | 45.0 | 19.0 | 14.0 | 12.0 | 7.0 |
| Average of TiC and TiN | $I_{B0}$ | 76.0 | 100.0 | 52.5 | 24.5 | 19.5 | 18.5 | 11.5 |

When the measurement range of 2θ is made from 20° to 145°, X-ray diffraction intensities of the B1-type metal compound film from the (111) plane to the (511) plane can be measured. There is a case where the X-ray diffraction peak of the (311) plane of the B1-type metal compound film overlaps with the X-ray diffraction peak of the WC(111) plane of the substrate. Standard X-ray diffraction intensity $I_0$ of the WC(111) plane shown in the JCPDS card No. 25-1047 is 0.25-fold the standard X-ray diffraction intensity $I_0$ of the WC(101) plane, so that a value deducted 0.25-fold X-ray diffraction intensity of the WC(101) plane from the X-ray diffraction intensity at which the (311) plane of the B1-type metal compound film and WC(111) plane are overlapped is deemed to be the X-ray diffraction intensity $I_B(311)$ of the (311) plane of the B1-type metal compound film. From the obtained X-ray diffraction intensities $I_B(hkl)$ from the (111) plane to the (511) plane of the B1-type metal compound, the texture coefficient $TC_B(422)$ defined by the numerical formula 3 and the $TC_B(311)$ defined by the numerical formula 4 can be obtained.

The B1-type metal compound film of the present invention shows a columnar crystal. The columnar crystal referred to in the present invention means a crystal in which a grain diameter measured at the direction perpendicular to the surface of the substrate is longer than that measured at the direction parallel to the surface of the substrate.

An average grain size of the B1-type metal compound film of the present invention means an average grain size of the B1-type metal compound grains in the B1-type metal compound film to the direction parallel to the substrate surface, which is in the range of within 1 μm from the interface between the α-type aluminum oxide film and the B1-type metal compound film or the interface between the adhesive film and the B1-type metal compound film to the depth direction. If there is unevenness at the interface, it is measured in the range within 1 μm from the position nearest to the substrate (at the valley portion). More specifically, an average grain size of the B1-type metal compound film can be measured from the lap surface of the B1-type metal compound film appeared by removing the α-type aluminum oxide film or the adhesive film according to the diamond-lap polishing of the coated tool surface. Whether it is within 1 μm from the interface between the α-type aluminum oxide film and the B1-type metal compound film or from the interface between the adhesive film and the B1-type metal compound film or not can be confirmed by cross-sectional observation. When the lap surface of the B1-type metal compound film is subjected to corrosion treatment by a fluoronitric acid, etc., a grain diameter of the B1-type metal compound film can be easily measured. The lap surface of the B1-type metal compound film is magnified to 10,000-fold by SEM and a SEM photograph is taken, three or more lines are drawn on the SEM photograph to random directions, distances between crystal grain boundaries of the B1-type metal compound film which crossed the lines are measured, the maximum value among these distances is made a maximum grain size of the B1-type metal compound grains in the B1-type metal compound film, and an average value of these distances is made an average grain size of the B1-type metal compound grains in the B1-type metal compound film. If an average grain size of the B1-type metal compound grains in the B1-type metal compound film of the present invention is less than about 0.15 μm, fracture resistance tends to be lowered, while if an average grain size of the B1-type metal compound grains in the B1-type metal compound film becomes large exceeding about 0.3 μm, wear resistance tends to be lowered. If a maximum grain size of the B1-type metal compound grains in the B1-type metal compound film of the present invention becomes large exceeding about 1.0 μm, wear resistance tends to be lowered. Also, if an average film thickness of the B1-type metal compound film of the present invention is less than about 3 μm, wear resistance tends to be lowered, while if an average film thickness of the B1-type metal compound film becomes thick exceeding about 20 μm, fracture resistance is lowered so that the average film thickness of the B1-type metal compound film is preferably about 3 to about 20 μm.

It is preferred when an undermost film comprising one or more metallic compounds of a nitride and/or carbonitride of Ti is present between the substrate and the B1-type type metal compound film, since adhesiveness of the substrate and the coating is heightened, and uniform columnar structure can be obtained in the B1-type metal compound film, whereby, uniformity of the α type aluminum oxide film structure and smoothness at the surface of the α type aluminum oxide film is improved. More specifically, there may be mentioned TiN and TiCN. If the average film thickness of the undermost film of the present invention is less than about 0.1 μm, adhesiveness between the substrate and the coating tends to be lowered, while if the average film thickness of the undermost film becomes thick exceeding about 1 μm, chipping resistance is lowered, so that the average film thickness of the undermost film is preferably about 0.1 to about 1 μm.

It is preferred when an adhesive film of a metallic compound comprising at least one of a carboxide, nitroxide or carbonitroxide of Ti, and a carboxide, nitroxide or carbonitroxide containing Ti and Al is present between the B1-type metal compound film and the α-type aluminum oxide film, since adhesiveness of the B1-type metal compound film and the α-type aluminum oxide film is improved. More specifically, there may be mentioned TiCO, TiNO, TiCNO, TiAlCO, TiAlNO and TiAlCNO. Among these, the adhesive film is more preferably a metallic compound comprising at least one of a carboxide, nitroxide and carbonitroxide containing Ti and Al, among these, the adhesive film is further preferably a carbonitroxide containing Ti and Al. The carbonitroxide containing Ti and Al may be specifically mentioned TiAlCNO. When TiAlCNO is to be prepared by the chemical vapor deposition method, it can be obtained by making the starting gas composition $TiCl_4$: 3.0 to 5.0 mol %, $AlCl_3$: 1.0 to 2.0 mol %, CO: 0.4 to 1.0 mol %, $N_2$: 30 to 40 mol %, and $H_2$: reminder, and coating conditions at a temperature: 975 to 1025° C., and a pressure: 90 to 110 hPa. Also, when the average film thickness of the adhesive film of the present invention is less than about 0.3 μm, adhesiveness between the B1-type metal compound film and the α-type aluminum oxide film tends to be lowered, while when the average film thickness of the adhesive film becomes thick exceeding about 2 μm, it tends to be broken from the fragile adhesive film, so that the average film thickness of the adhesive film is preferably about 0.3 to about 2 μm.

It is preferred to provide at least one layer of an outer film of a metallic compound comprising one or two of a nitride and/or carbonitride of Ti on the surface of the α type aluminum oxide film, since the corner used for cutting can be easily identified by the difference in color, etc. More specifically, there may be mentioned TiN and TiCN. Also, if an average film thickness of the whole outer film of the present invention is less than about 0.1 μm, uniform color tone can be hardly obtained, while if an average film thickness of the whole outer film becomes thick exceeding about 2 μm, welding resistance tends to be lowered, so that the average film thickness of the whole outer film is preferably about 0.1 to about 2 μm.

The coated tool of the present invention can be prepared by coating a coating on the surface of the substrate according to the physical vapor deposition method or chemical vapor deposition method. Among these, chemical vapor deposition method is preferred since high adhesiveness between the substrate and the coating can be obtained. When the chemical vapor deposition method is employed, the α-type aluminum oxide film of the present invention can be obtained by providing a coating with a film thickness of about 0.1 to about 0.3 μm under the First step coating conditions where a starting gas composition of $AlCl_3$: 2.1 to 5.0 mol %, $CO_2$: 2.5 to 4.0 mol %, HCl: 2.0 to 3.0 mol %, and $H_2$: reminder, at a temperature: 990 to 1000° C., and a pressure: 60 to 80 hPa, and then, providing a coating with a film thickness of about 0.4 to about 9.9 μm under the Second step coating conditions where a starting gas composition of $AlCl_3$: 2.1 to 5.0 mol %, $CO_2$: 2.5 to 4.0 mol %, HCl: 2.0 to 3.0 mol %, $H_2S$: 0.28 to 0.45 mol % and $H_2$: reminder, at a temperature: 990 to 1000° C., and a pressure: 60 to 80 hPa.

To obtain the α-type aluminum oxide film of the present invention, it is coated under the conditions of First step without adding $H_2S$ for 5 to 20 minutes, and thereafter, under the conditions of Second step to which $H_2S$ is added. By not adding $H_2S$ at the initial stage of the coating, core formation of α-type aluminum oxide and film-forming speed are optimized, whereby a ground of the α-type aluminum oxide film which is uniform and dense can be obtained. In Second step, 0.28 to 0.45 mol % of $H_2S$ is added, so that a grain-growth speed of the α-type aluminum oxide film is increased whereby an α-type aluminum oxide film having uniform structure, high adhesiveness and high strength can be obtained. Incidentally, when $H_2S$ is added from the initial stage, core formation and grain-growth speed of the α-type aluminum oxide are rapidly increased, so that pores are formed at the interface of the α-type aluminum oxide film and the adhesive film. These pores cause lowering in adhesiveness and film strength of the α-type aluminum oxide film.

In the coating conditions of the α-type aluminum oxide film in First step and Second step, in the case of, for example, a temperature: 1000° C., and a pressure: 70 hPa, if $CO_2$ contained in the starting gas becomes large exceeding 4.0 mol %, $TC_A(104)/TC_A(012)$ becomes less than 2.0 whereby cutting properties are lowered. To the contrary, if $CO_2$ contained in the starting gas becomes less than 2.5 mol %, grain-growth speed of the α-type aluminum oxide markedly lowered and film strength is lowered, whereby adhesiveness of the film, wear resistance, crater resistance and chipping resistance are lowered. For example, in the case of a temperature: 1000° C., and a pressure: 70 hPa, if $AlCl_3$ contained in the starting gas becomes less than 2.1 mol %, $TC_A(104)/TC_A(012)$ becomes less than 2.0 whereby cutting properties are lowered. To the contrary, if $AlCl_3$ contained in the starting gas becomes large exceeding 5.0 mol %, α-type aluminum oxide is formed in a gas phase so that the α-type aluminum oxide film cannot be obtained.

In the case where the chemical vapor deposition method is used, the B1-type metal compound film of the present invention can be obtained by the coating conditions where a starting gas composition of $TiCl_4$: 10 to 15 mol %, $CH_3CN$: 1 to 3 mol %, $N_2$: 0 to 20 mol %, and $H_2$: reminder, at a temperature: 780 to 830° C., and a pressure: 80 to 100 hPa. For example, in the case of a temperature: 800° C., and a pressure: 90 hPa, if $CH_3CN$ contained in the starting gas becomes less than 1.0 mol %, grain-growth speed of the B1-type metal compound film markedly lowered, and film strength is lowered in some cases. If $CH_3CN$ contained in the starting gas becomes large exceeding 3.0 mol %, X-ray diffraction peak intensity at the (311) plane of the B1-type metal compound film becomes high in some cases, and $TC_B(422)/TC_B(311)$ becomes less than 1.5 in some cases, so that an average grain size of the B1-type metal compound film exceeds 0.3 μm, and as a result, adhesiveness of the film, wear resistance, crater resistance and chipping resistance are lowered in some cases. For example, in the case of a temperature: 800° C., and a pressure: 90 hPa, if $TiCl_4$ contained in the starting gas becomes less than 10 mol %, $TC_B(422)/TC_B(311)$ becomes less than 1.5, whereby adhesiveness of the film, wear resistance, crater resistance and chipping resistance are lowered in some cases. If $TiCl_4$ contained in the starting gas becomes large exceeding 15.0 mol %, an average grain size of the B1-type metal compound film becomes less than 0.15 μm, and the structure becomes granular crystals, so that chipping resistance is markedly lowered in some cases. Incidentally, the undermost film, adhesive film and outer film of the present invention can be coated by the conventional physical vapor deposition method or chemical vapor deposition method.

As the uses of the coated tool of the present invention, there may be mentioned a cutting tool represented by an insert and a wear resistant tool represented by a metal mold. When the coated tool of the present invention is applied to the tool to which such a high stress is applied, high effects can be obtained. When the coated tool of the present invention is used as a cutting tool, chipping at an edge portion to which a stress is particularly concentrated hardly occurs and tool life is increased. When the coated tool of the present invention is used as a wear resistant tool, in particular, chipping at the edge portion is hardly caused whereby tool life is increased.

Example 1

A mixed powder comprising 89% by weight of WC powder having an average grain size of 4.5 μm, 2% by weight of TiCN powder having an average grain size of 1.5 μm, 2% by weight of (Ta,Nb)C powder having an average grain size of 1.5 μm, and 7% by weight of Co powder having an average grain size 1.5 μm was sintered to obtain a cemented carbide. The cemented carbide was worked to an ISO standard CNMG120412-shaped insert and used as a substrate. Incidentally, at the neighbor of the surface of the cemented carbide substrate, a β-free layer consisting of WC and Co is formed. A thickness of the β-free layer at a relief surface was 15 μm. To the substrate was provided a coating with the film constitution shown in Table 3.

TABLE 3

Film constitution of coating films (film thickness and composition)

| Sample No. | First layer Undermost film TiN (μm) | Second layer B1-type metal compound film TiCN (μm) | Third layer Adhesive film TiAlCNO (μm) | Fourth layer α-type aluminum oxide film α-Al$_2$O$_3$ (μm) | Fifth layer Outer film 1 TiCN (μm) | Sixth layer Outer film 2 TiN (μm) | Total film thickness (μm) |
|---|---|---|---|---|---|---|---|
| Present products 1 to 8 | 0.2 | 8 | 0.8 | 5.5 | 0.5 | 0.5 | 15.5 |
| Comparative products 1, 2 and 4 | 0.2 | 8 | 0.8 | 5.5 | 0.5 | 0.5 | 15.5 |
| Comparative product 3 | 0.2 | 9 | 0.8 | 5.5 | 0.5 | 0.5 | 16.5 |
| Comparative product 5 | 1.2 | 8 | 0.8 | 5.5 | 0.5 | 0.5 | 16.5 |

The TiN film which is the first layer positioned at the closest to the substrate side was coated under the coating conditions where a starting gas composition is TiCl$_4$: 9.0 mol %, N$_2$: 40 mol %, and H$_2$: reminder, at temperature: 850° C., and a pressure: 160 hPa. The TiCN film as the second layer was coated under the coating conditions shown in Table 4.

TABLE 4

Coating conditions of TiCN film

| Sample No. | Starting gas composition (mol %) | | | | | | Temperature (° C.) | Pressure (hPa) |
| | TiCl$_4$ | CH$_3$CN | C$_2$H$_6$ | C$_2$H$_4$ | H$_2$ | N$_2$ | | |
|---|---|---|---|---|---|---|---|---|
| Present product 1 | 10.8 | 1.3 | — | — | 74.4 | 13.5 | 800 | 90 |
| Present product 2 | 10.8 | 1.3 | — | — | 74.4 | 13.5 | 800 | 90 |
| Present product 3 | 10.8 | 1.3 | — | — | 74.4 | 13.5 | 850 | 90 |
| Present product 4 | 10.8 | 1.3 | — | — | 74.4 | 13.5 | 900 | 90 |
| Present product 5 | 10.8 | 1.3 | — | — | 74.4 | 13.5 | 800 | 90 |
| Present product 6 | 10.7 | 1.7 | — | — | 74.1 | 13.5 | 800 | 90 |
| Present product 7 | 10.7 | 1.7 | — | — | 74.1 | 13.5 | 850 | 90 |
| Present product 8 | 10.8 | 1.3 | — | — | 74.4 | 13.5 | 900 | 90 |
| Comparative product 1 | 10.8 | 1.3 | — | — | 74.4 | 13.5 | 800 | 90 |
| Comparative product 2 | 10.8 | 1.3 | — | — | 74.4 | 13.5 | 800 | 90 |
| Comparative product 3 | 10.0 | 0.72 | — | 2.7 | 73.28 | 13.3 | 860 | 90 |
| Comparative product 4 | 10.7 | 1.7 | — | — | 74.1 | 13.5 | 850 | 90 |
| Comparative product 5 | 6.0 | — | 0.4 | — | 53.5 | 40.1 | 930 | 360 |

TiAlCNO film at the third layer was coated under the coating conditions where a starting gas composition of TiCl$_4$: 4.0 mol %, AlCl$_3$: 1.2 mol %, N$_2$: 34 mol %, CO: 0.6 mol %, and H$_2$: reminder, at a temperature: 1000° C., and a pressure: 100 hPa.

With regard to the α-type Al$_2$O$_3$ film at the fourth layer, in the case of Present products, coating was carried out under coating conditions of First step shown in Table 5, subsequently under coating conditions of Second step shown in Table 6.

TABLE 5

Coating conditions of First step of α-Al₂O₃ film

| Sample No. | Starting gas composition (mol %) | | | | | Temperature (° C.) | Pressure (hPa) | Thickness (μm) |
|---|---|---|---|---|---|---|---|---|
| | AlCl₃ | CO₂ | HCl | H₂ | H₂S | | | |
| Present product 1 | 2.3 | 3.6 | 2.0 | 92.1 | — | 1000 | 70 | 0.3 |
| Present product 2 | 2.3 | 3.6 | 2.0 | 92.1 | — | 1000 | 70 | 0.3 |
| Present product 3 | 2.3 | 3.6 | 2.0 | 92.1 | — | 1000 | 70 | 0.3 |
| Present product 4 | 2.3 | 3.6 | 2.0 | 92.1 | — | 1000 | 70 | 0.3 |
| Present product 5 | 2.2 | 3.6 | 2.1 | 92.1 | — | 1000 | 70 | 0.3 |
| Present product 6 | 2.2 | 3.6 | 2.1 | 92.1 | — | 1000 | 70 | 0.3 |
| Present product 7 | 2.2 | 3.6 | 2.1 | 92.1 | — | 1000 | 70 | 0.3 |
| Present product 8 | 2.1 | 3.4 | 2.1 | 92.4 | — | 1000 | 70 | 0.3 |

TABLE 6

Coating conditions of Second step of α-Al₂O₃ film

| Sample No. | Starting gas composition (mol %) | | | | | Temperature (° C.) | Pressure (hPa) | Thickness (μm) |
|---|---|---|---|---|---|---|---|---|
| | AlCl₃ | CO₂ | HCl | H₂ | H₂S | | | |
| Present product 1 | 2.3 | 3.6 | 2.0 | 91.8 | 0.3 | 1000 | 70 | 5.2 |
| Present product 2 | 2.3 | 3.6 | 2.0 | 91.8 | 0.3 | 1000 | 70 | 5.2 |
| Present product 3 | 2.3 | 3.6 | 2.0 | 91.8 | 0.3 | 1000 | 70 | 5.2 |
| Present product 4 | 2.3 | 3.6 | 2.0 | 91.8 | 0.3 | 1000 | 70 | 5.2 |
| Present product 5 | 2.2 | 3.6 | 2.1 | 91.82 | 0.28 | 1000 | 70 | 5.2 |
| Present product 6 | 2.2 | 3.6 | 2.1 | 91.82 | 0.28 | 1000 | 70 | 5.2 |
| Present product 7 | 2.2 | 3.6 | 2.1 | 91.82 | 0.28 | 1000 | 70 | 5.2 |
| Present product 8 | 2.1 | 3.4 | 2.1 | 92.12 | 0.28 | 1000 | 70 | 5.2 |

In the case of Comparative products, the α-type Al₂O₃ film at the fourth layer was coated by the coating conditions as mentioned in Table 7.

TABLE 7

Coating conditions of Second step of α-Al₂O₃ film

| Sample No. | Starting gas composition (mol %) | | | | | Temperature (° C.) | Pressure (hPa) | Thickness (μm) |
|---|---|---|---|---|---|---|---|---|
| | AlCl₃ | CO₂ | HCl | H₂ | H₂S | | | |
| Comparative product 1 | 2.3 | 3.6 | 2.0 | 91.8 | 0.3 | 1050 | 70 | 5.5 |
| Comparative product 2 | 1.9 | 3.6 | 2.0 | 92.2 | 0.3 | 1000 | 70 | 5.5 |
| Comparative product 3 | 2.0 | 7.4 | 1.5 | 88.83 | 0.27 | 1000 | 70 | 5.5 |
| Comparative product 4 | 1.8 | 3.6 | 2.0 | 92.3 | 0.3 | 1000 | 70 | 5.5 |
| Comparative product 5 | 1.7 | 3.6 | 2.2 | 92.22 | 0.28 | 1000 | 70 | 5.5 |

In both of Present products and Comparative products, TiCN film at the fifth layer was coated under coating conditions where a starting gas composition of $TiCl_4$: 7.3 mol %, $N_2$: 11.6 mol %, $CH_3CN$: 1.2 mol %, and $H_2$: reminder, a temperature: 1000° C., and a pressure: 90 hPa. TiN film of the sixth layer which is outermost layer was coated under coating conditions where a starting gas composition of $TiCl_4$: 9.0 mol %, $N_2$: 40 mol %, and $H_2$: the reminder, at a temperature: 1000° C., and a pressure: 160 hPa.

With regard to the obtained samples, X-ray diffraction measurements using CuKα line were carried out to obtain $TC_A(104)$ and $TC_A(012)$. The value of $TC_A(104)/TC_A(012)$ was calculated, and the values are shown in Table 8. The fifth layer and the sixth layer of the samples of the present invention were removed by fluoronitric acid, and a SEM photograph of the surface structure of the α-type $Al_2O_3$ film was taken by magnifying to 10,000-fold with SEM (scanning-type electron microscope). Three lines were drawn on the SEM photograph to random directions, distances between crystal grain boundaries of the α-type aluminum oxide film which crossed the lines were measured, and the average value was made an average grain size of the α-type aluminum oxide film. The results are shown in Table 8. Also, it was confirmed from cross-sectional observation that the α-type $Al_2O_3$ films which are the fourth layers of Present products are columnar crystals, the α-type $Al_2O_3$ film which is the fourth layer of Comparative product 1 is columnar crystal, and the α-type $Al_2O_3$ films which are the fourth layers of Comparative products 2 to 5 are massive.

TABLE 8

| | α-Al₂O₃ film | |
|---|---|---|
| Sample No. | $TC_A(104)/TC_A(012)$ | Average grain size (μm) |
| Present product 1 | 6.12 | 0.50 |
| Present product 2 | 5.43 | 0.80 |
| Present product 3 | 4.52 | 1.20 |
| Present product 4 | 3.43 | 1.30 |
| Present product 5 | 3.00 | 1.40 |
| Present product 6 | 3.00 | 1.40 |
| Present product 7 | 3.00 | 1.40 |
| Present product 8 | 2.05 | 1.50 |
| Comparative product 1 | 4.00 | 4.00 |
| Comparative product 2 | 1.82 | 1.40 |
| Comparative product 3 | 0.20 | 0.80 |
| Comparative product 4 | 0.90 | 1.40 |
| Comparative product 5 | 1.50 | 2.50 |

With regard to the sample in which the fifth layer and the sixth layer had been removed by a fluoronitric acid, X-ray diffraction measurement was carried out using CuKα1 line wherein the measurement range of 2θ was made 20° to 145°, whereby $TC_B(422)$ of the second layer of TiCN film and $TC_B(311)$ of the second layer of the same were obtained. At this time, X-ray diffraction peak of the (311) plane of the TiCN film at the second layer and X-ray diffraction peak of the WC(111) plane of the substrate were overlapped, so that the value in which 0.25-fold of X-ray diffraction intensity of the WC(101) plane was subtracted from the X-ray diffraction intensity of the (311) plane of the TiCN film was deemed to be X-ray diffraction intensity of the (311) plane of the TiCN film. A ratio of $TC_B(422)/TC_B(311)$ of TiCN film at the second layer was shown in Table 9. Also, among the (111) plane to (511) plane of TiCN film, the crystal plane showing the highest X-ray diffraction intensity is shown in Table 9.

According to the diamond-lap polishing of the sample surface, the lap surface of the TiCN film as the second layer which was appeared by removing the third layer to the sixth layer was treated with a fluoronitric acid, and a SEM photograph was taken by magnifying to 10,000-fold by SEM. Three lines were drawn on the SEM photograph to random directions, distances between crystal grain boundaries of the TiCN film crossing the lines were measured, the maximum value of these was made a maximum grain size of the TiCN film, and an average value of these was made an average grain size of the TiCN film. Incidentally, it was confirmed by cross-sectional observation that the measured positions were within 1 μm from the interface between the TiAlCNO film of the third layer and the TiCN film of the second layer to the depth direction. The average grain size and the maximum grain size of the TiCN film were shown in Table 9. Also, it was confirmed from cross-sectional observation that the TiCN films of the second layers of Present products and Comparative products were columnar crystals.

TABLE 9

| Sample No. | TiCN film | | | |
| --- | --- | --- | --- | --- |
| | $TC_B(422)/TC_B(311)$ | Maximum X-ray diffraction intensity plane | Average grain size (μm) | Maximum grain size (μm) |
| Present product 1 | 2.00 | (422) | 0.20 | 0.80 |
| Present product 2 | 2.00 | (422) | 0.20 | 0.80 |
| Present product 3 | 0.50 | (311) | 0.40 | 0.80 |
| Present product 4 | 0.20 | (220) | 0.70 | 1.84 |
| Present product 5 | 2.00 | (422) | 0.25 | 0.80 |
| Present product 6 | 1.50 | (422) | 0.30 | 1.00 |
| Present product 7 | 0.50 | (311) | 0.40 | 0.80 |
| Present product 8 | 0.20 | (220) | 0.70 | 1.84 |
| Comparative product 1 | 2.00 | (422) | 0.20 | 0.80 |
| Comparative product 2 | 2.00 | (422) | 0.20 | 0.80 |
| Comparative product 3 | 0.20 | (220) | 0.40 | 2.40 |
| Comparative product 4 | 0.50 | (311) | 0.40 | 0.80 |
| Comparative product 5 | 0.20 | (220) | 0.25 | 2.40 |

By using the obtained samples, adhesiveness evaluation test of the coating film and cutting test were carried out.

Adhesiveness Evaluation Test of the Coating Film 5 specimens per one sample were prepared, adhesiveness evaluation test was carried out wherein a Rockwell indenter is pushed into the surface of the sample with an applied load of 60 kgf by using a Rockwell hardness tester and peeling of the coating from the substrate was examined. The results are shown in Table 10.

TABLE 10

| | Adhesiveness evaluation test (n = 5) |
| --- | --- |
| Sample No. | Number of sample(s) coating of which peeled off from the substrate (number) |
| Present product 1 | 0 |
| Present product 2 | 0 |
| Present product 3 | 0 |
| Present product 4 | 0 |
| Present product 5 | 0 |
| Present product 6 | 0 |
| Present product 7 | 0 |
| Present product 8 | 0 |
| Comparative product 1 | 2 |
| Comparative product 2 | 2 |
| Comparative product 3 | 4 |
| Comparative product 4 | 5 |
| Comparative product 5 | 5 |

From Table 10, with regard to adhesiveness between the substrate and the coated film, it can be understood that those of Present products are superior to those of Comparative products.

As the cutting test, 5 specimens per one sample were prepared, S55C (Hardness: $H_B255$) having a cross-sectional shape shown in FIG. 1 in which 50 mm×50 mm square hole had been made along with the center axis of a cylinder having a diameter 180 mm×a length 120 mm was used as a work piece material, and edge face turning was carried out under the following mentioned cutting conditions.

Cutting Conditions

Cutting speed: 220 m/min

Depth of cut: 2 mm

Feed rate: 0.35 mm/rev

Cutting form: Wet (using water-soluble emulsion)

Cutting time per 1 time: 15 min

Number of tested times: 5 times

After the cutting test, a size of the surface area wherein the cemented carbide substrate is exposed to the surface at the rake face was classified into large, medium and small, and the number of these are shown in Table 11. Also, a number of samples in which it was fractured by the progress of crater wear and a number of samples which cause chipping at the cutting blade were examined, and these results are shown in Table 11. Also, with regard to the samples which were not fractured, flank wear was measured, and an average value thereof is shown in Table 11.

TABLE 11

Cutting test results (n = number of tested samples)

| Sample No. | Surface area of exposed substrate (n = 5) | | | Number of sample(s) causing chipping [number] (n = 5) | Sample(s) fractured by crater wear [number] (n = 5) | Average of flank wear of sample(s) not fractured (n = number of measured samples) |
|---|---|---|---|---|---|---|
| | Large [number] | Medium [number] | Small [number] | | | |
| Present product 1 | 0 | 0 | 0 | 0 | 0 | 0.70 mm (n = 5) |
| Present product 2 | 0 | 0 | 0 | 0 | 0 | 0.80 mm (n = 5) |
| Present product 3 | 0 | 0 | 1 | 0 | 0 | 0.90 mm (n = 5) |
| Present product 4 | 0 | 0 | 2 | 0 | 0 | 1.00 mm (n = 5) |
| Present product 5 | 0 | 0 | 3 | 0 | 0 | 1.05 mm (n = 5) |
| Present product 6 | 0 | 0 | 4 | 0 | 0 | 1.10 mm (n = 5) |
| Present product 7 | 0 | 0 | 5 | 0 | 0 | 1.15 mm (n = 5) |
| Present product 8 | 0 | 0 | 5 | 0 | 0 | 1.20 mm (n = 5) |
| Comparative product 1 | 4 | 1 | 0 | 0 | 1 | 1.50 mm (n = 4) |
| Comparative product 2 | 5 | 0 | 0 | 0 | 2 | 1.57 mm (n = 3) |
| Comparative product 3 | 5 | 0 | 0 | 4 | 2 | 1.57 mm (n = 3) |
| Comparative product 4 | 5 | 0 | 0 | 5 | 4 | 1.87 mm (n = 1) |
| Comparative product 5 | 5 | 0 | 0 | 5 | 5 | — |

As can be clearly seen from the results shown in Table 11, it can be found that Present products are excellent in adhesiveness of the film as compared with Comparative products so that the substrate is hardly exposed, and chipping resistance, crater resistance, fracture resistance and wear resistance are excellent. Incidentally, Comparative products caused fracture and chipping, and flank wear was 1.50 mm or more whereby they are judged to be end of tool life. On the other hand, Present products did not cause fracture and chipping, and flank wear was 1.20 mm or less, so that it was possible to elongate the cutting time. That is, it can be understood that Present products have longer tool life than those of Comparative products.

The invention claimed is:

1. A coated tool comprising a substrate and a coating provided on the surface of the substrate,
at least one layer of the coating being an α-type aluminum oxide film,
an average film thickness of the α-type aluminum oxide film being about 0.5 to about 10 μm,
an average grain size of α-type aluminum oxide grains in the α-type aluminum oxide film being about 0.5 μm to 0.8 μm, and
a first texture coefficient $TC_A(012)$ of a (012) plane of the α-type aluminum oxide film and a second texture coefficient $TC_A(104)$ of a (104) plane of the α-type aluminum oxide film satisfy $TC_A(104)/TC_A(012)$ 2.0, wherein:

$$TC_A(012) = \frac{\frac{I_A(012)}{I_{A0}(012)}}{\frac{1}{8}\left[\frac{I_A(012)}{I_{A0}(012)} + \frac{I_A(104)}{I_{A0}(104)} + \frac{I_A(110)}{I_{A0}(110)} + \frac{I_A(113)}{I_{A0}(113)} + \frac{I_A(024)}{I_{A0}(024)} + \frac{I_A(116)}{I_{A0}(116)} + \frac{I_A(124)}{I_{A0}(124)} + \frac{I_A(030)}{I_{A0}(030)}\right]};$$

$$TC_A(104) = \frac{\frac{I_A(104)}{I_{A0}(104)}}{\frac{1}{8}\left[\frac{I_A(012)}{I_{A0}(012)} + \frac{I_A(104)}{I_{A0}(104)} + \frac{I_A(110)}{I_{A0}(110)} + \frac{I_A(113)}{I_{A0}(113)} + \frac{I_A(024)}{I_{A0}(024)} + \frac{I_A(116)}{I_{A0}(116)} + \frac{I_A(124)}{I_{A0}(124)} + \frac{I_A(030)}{I_{A0}(030)}\right]};$$

$I_A(hkl)$: X-ray diffraction intensity measured at (hkl) plane of the α-type aluminum oxide film;
$I_{A0}(hkl)$: standard X-ray diffraction intensity of the (hkl) plane of α-type aluminum oxide according to JCPDS card No. 10-173;
(hkl) are eight planes of (012), (104), (110), (113), (024), (116), (124) and (030); and
the α-type aluminum oxide film is columnar crystal.

2. The coated tool according to claim 1, wherein the coating comprises
the α-type aluminum oxide film alone, or,
a metal compound film of one or more of a carbide, nitride, oxide, carbonitride, carboxide, nitroxide, carbonitroxide and boride of Ti, Zr, Hf, V, Nb, Ta, Cr, Mo, W, Al and Si, and mutual solid solutions thereof, and the α-type aluminum oxide film.

3. The coated tool according to claim 1, wherein $TC_A(104)/TC_A(012)$ is 4.0 or more.

4. The coated tool according to claim 1, wherein $TC_A(104)/TC_A(012)$ is 6.0 or more.

5. The coated tool according to claim 1, wherein
a B1-type metal compound film is present between the substrate and the α-type aluminum oxide film,
an average grain size of B1-type metal compound grains in the B1-type metal compound film is about 0.15 to about 0.3 μm,
a maximum grain size of the B1-type metal compound grains in the B1-type metal compound film is about 1.0 μm or less, and
a third texture coefficient $TC_B(422)$ of a (422) plane of the B1-type metal compound film and a fourth texture coefficient $TC_B(311)$ of a (311) plane of the B1-type metal compound film satisfy $TC_B(422)/TC_B(311)>1.5$, wherein:

$$TC_B(422) = \frac{\frac{I_B(422)}{I_{B0}(422)}}{\frac{1}{8}\left[\frac{I_B(111)}{I_{B0}(111)} + \frac{I_B(220)}{I_{B0}(220)} + \frac{I_B(200)}{I_{B0}(200)} + \frac{I_B(311)}{I_{B0}(311)} + \frac{I_B(331)}{I_{B0}(331)} + \frac{I_B(420)}{I_{B0}(420)} + \frac{I_B(422)}{I_{B0}(422)} + \frac{I_B(511)}{I_{B0}(511)}\right]};$$

$$TC_B(311) = \frac{\frac{I_B(311)}{I_{B0}(311)}}{\frac{1}{8}\left[\frac{I_B(111)}{I_{B0}(111)} + \frac{I_B(220)}{I_{B0}(220)} + \frac{I_B(200)}{I_{B0}(200)} + \frac{I_B(311)}{I_{B0}(311)} + \frac{I_B(331)}{I_{B0}(331)} + \frac{I_B(420)}{I_{B0}(420)} + \frac{I_B(422)}{I_{B0}(422)} + \frac{I_B(511)}{I_{B0}(511)}\right]};$$

$I_B(hkl)$: X-ray diffraction intensity measured at (hkl) plane of the B1-type metal compound film;
$I_{B0}(hkl)$: average value of
standard X-ray diffraction intensity of a (hkl) plane of TiC according to JCPDS card No. 32-1383 and
standard X-ray diffraction intensity of a (hkl) plane of TiN according to JCPDS card No. 38-1420; and
(hkl) are eight planes of (111), (220), (200), (311), (331), (420), (422) and (511).

6. The coated tool according to claim 5, wherein the B1-type metal compound film is columnar crystal.

7. The coated tool according to claim 5, wherein the B1-type metal compound film is a metal compound film comprising a carbonitride of Ti.

8. The coated tool according to claim 5, wherein an average film thickness of the B1-type metal compound film is about 3 μm to about 20 μm.

9. The coated tool according to claim 5, wherein there is an undermost film between the substrate and the B1-type metal compound film, and
the undermost film is a metal compound film comprising one or both of a nitride and carbonitride of Ti.

10. The coated tool according to claim 9, wherein an average film thickness of the undermost film is about 0.1 μm to about 1 μm.

11. The coated tool according to claim 5, wherein there is an adhesive film between the B1-type metal compound film and the α-type aluminum oxide film, and
the adhesive film comprises a metal compound film comprising at least one of a carboxide, nitroxide and carbonitroxide of Ti, and a carboxide, nitroxide and carbonitroxide of Ti and Al.

12. The coated tool according to claim 11, wherein the adhesive film is at least one selected from the group consisting of TiCO, TiNO, TiCNO, TiAlCO, TiAlNO and TiAlCNO.

13. The coated tool according to claim 11, wherein the adhesive film is a metal compound film comprising at least one of a carboxide, nitroxide and carbonitroxide of Ti and Al.

14. The coated tool according to claim 11, wherein an average film thickness of the adhesive film is about 0.3 μm to about 2 μm.

15. The coated tool according claim 1, wherein a surface of the α-type aluminum oxide film is coated by an outer film, and the outer film is a metal compound film comprising one or both of a nitride and carbonitride of Ti.

16. The coated tool according to claim 15, wherein an average film thickness of the outer film is about 0.1 μm to about 2 μm.

17. The coated tool according to claim 1, wherein the α-type aluminum oxide film is formed by a chemical vapor deposition method, and comprises
a coated film having a film thickness of about 0.1 to about 0.3 μm formed under first step coating conditions of a starting gas composition being $AlCl_3$: 2.1 to 5.0 mol %, $CO_2$: 2.5 to 4.0 mol %, HCl: 2.0 to 3.0 mol %, $H_2$: the remainder, at a temperature: 990 to 1000° C., under a pressure: 60 to 80 hPa, and
a coated film having a film thickness of about 0.4 to about 9.9 μm formed under second step coating conditions of a starting gas composition being $AlCl_3$: 2.1 to 5.0 mol %, $CO_2$: 2.5 to 4.0 mol %, HCl: 2.0 to 3.0 mol %, $H_2S$: 0.28 to 0.45 mol %, $H_2$: the remainder, at a temperature: 990 to 1000° C., under a pressure: 60 to 80 hPa.

18. The coated tool according to claim 1, wherein $TC_A(104)/TC_A(012) \geq 3.0$.

\* \* \* \* \*